United States Patent
Roy

(10) Patent No.: US 6,611,006 B2
(45) Date of Patent: Aug. 26, 2003

(54) VERTICAL COMPONENT PERIPHERAL STRUCTURE

(75) Inventor: Mathieu Roy, Joue les Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/855,994

(22) Filed: May 15, 2001

(65) Prior Publication Data

US 2001/0054739 A1 Dec. 27, 2001

(30) Foreign Application Priority Data

May 17, 2000 (FR) ............................................ 00 06300

(51) Int. Cl.⁷ ...................... H01L 31/0232; H01L 29/87
(52) U.S. Cl. ........................ 257/150; 257/170; 257/109
(58) Field of Search .................. 257/109, 117–118, 257/125, 127, 150, 168–171, 605, 182, 170

(56) References Cited

U.S. PATENT DOCUMENTS

| | | | |
|---|---|---|---|
| 5,596,210 A | * 1/1997 | Konishi et al. ............... | 257/98 |
| 5,796,123 A | 8/1998 | Salbreuax | |
| 5,986,289 A | 11/1999 | Simmonet | |

FOREIGN PATENT DOCUMENTS

| | | | |
|---|---|---|---|
| FR | 2 556 881 A1 | 6/1985 | |
| JP | 60042875 A | * 3/1985 | |

OTHER PUBLICATIONS

French Search Report from French Patent Application No. 00/06300, filed May 17, 2000.
Patent Abstracts of Japan, vol. 006, No. 087 (E–108), May 25, 1982 & JP 57 021862 A (NEC Corp.).

* cited by examiner

Primary Examiner—Minh Loan Tran
Assistant Examiner—Thomas L. Dickey
(74) Attorney, Agent, or Firm—Wolf, Greenfield & Sacks, P.C.; James H. Morris; John N. Anastasi

(57) ABSTRACT

A power component formed in an N-type silicon substrate, the lower and upper surfaces of which respectively include a first and a second P-type region that do not extend to the component periphery, a high voltage being capable of existing between the first and second regions and having to be withstood by the junctions between the first and second regions and the substrate. A deep insulating region that does not join the first region is provided at the lower periphery of the component, the lower surface of the substrate between said deep insulating region and the first region being coated with an insulating layer, the height of the deep insulating region being greater than that of a possible soldering upward extension formed during the soldering of the lower surface on a heat sink.

26 Claims, 2 Drawing Sheets

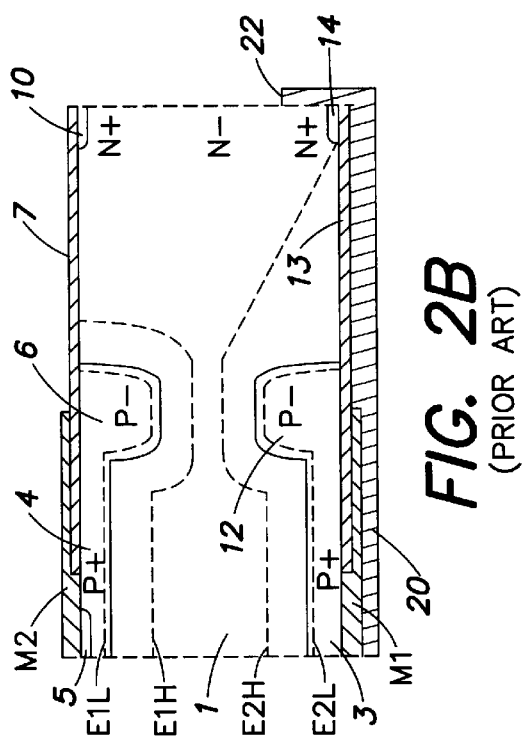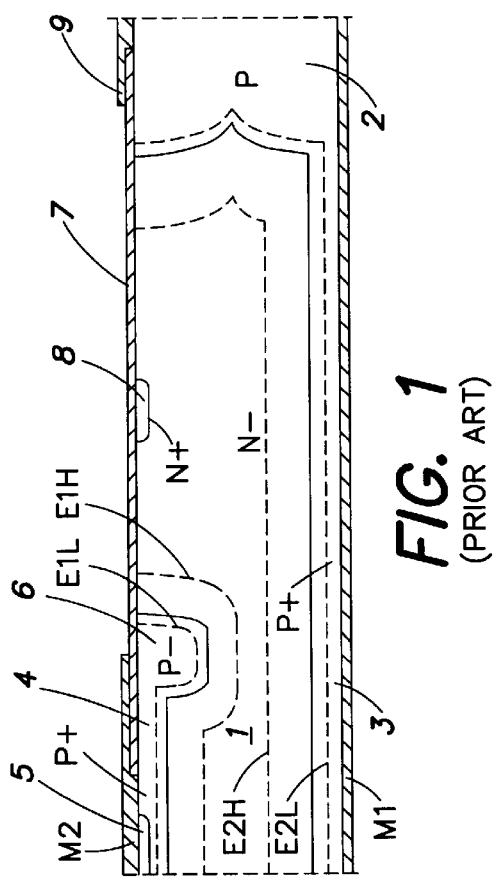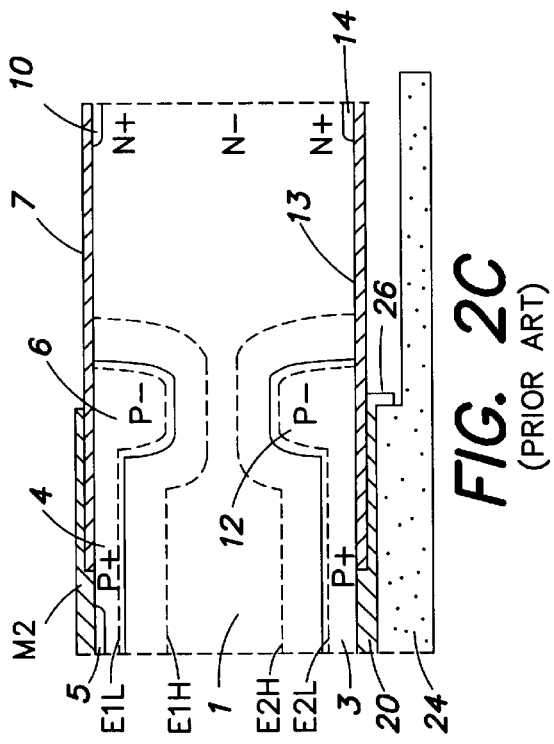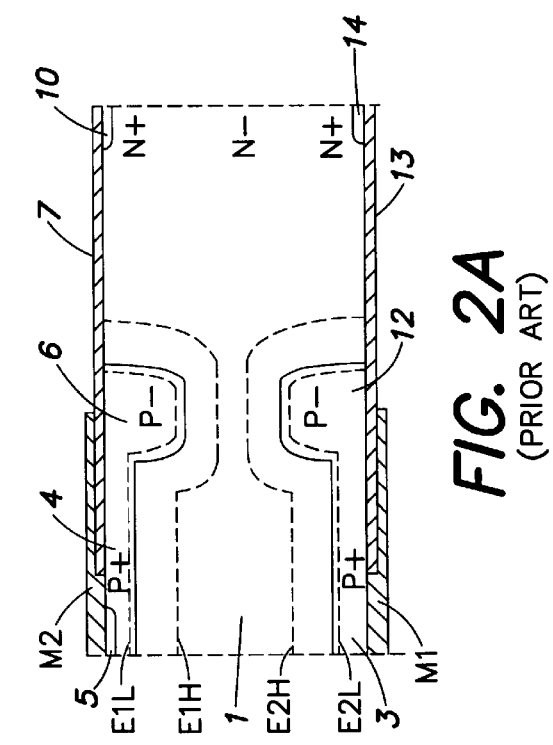

VERTICAL COMPONENT PERIPHERAL STRUCTURE

BACKGROUND OF THE INVENTION

1. Field of the Invention

The present invention relates to power components and more specifically to an optimization of the breakdown voltage of vertical type power components, the rear surface of which is capable of being soldered to a heat sink.

2. Discussion of the Related Art

FIG. 1 very schematically shows a partial cross-section view of a portion of a conventional high-voltage power component in a border region thereof. The component, a portion only of which is illustrated, is formed in a lightly-doped silicon substrate 1. In the present description, it will be considered that this substrate is of type N but, of course, all conductivity types may be inverted. The component is delimited at its periphery by a P-type isolating wall 2 extending from the upper surface to the lower surface of the substrate.

In a current configuration of high-voltage vertical semiconductor components, a P-type layer 3 is formed, continuously or not, on the lower substrate surface and extends to reach the isolating wall. On the upper substrate surface side, a layer 4, also of type P, is present. P-type layer 4, N-type substrate 1, and P-type layer 3 are layers that constitute a high-voltage vertical component, the high breakdown voltage being especially due to the large thickness and to the low doping level of substrate 1. PNP layers 4-1-3 may, for example, form a transistor.

A rear surface metallization M1 is in contact with the entire rear surface of the component and a metallization M2 is connected, directly or indirectly, to layer 4. This connection is direct in the case where a PNP transistor is desired to be formed. In the shown case, where it is desired to form a thyristor with or without a gate, an additional heavily-doped N-type layer 5 is formed to form the cathode of the thyristor in contact with metallization M2. The periphery of layer 4 is spaced apart from isolating wall 2 by a portion of substrate 1 and preferably includes a lightly-doped P-type area 6 (P−) deeper than region 4.

When a positive voltage is applied between metallizations M1 and M2, the blocking (non-conducting) junction is the junction between substrate 1 and P region 4–6. Around this junction, the breakdown voltage is determined by a so-called space charge area delimited by equipotential surfaces E1L and E1H, shown in dotted lines in the drawing. Equipotential surface E1L indicates the area at the low potential of electrode M2, for example, 0 volts. Equipotential surface E1H designates the area at the high potential of electrode M1, for example, 600 volts.

When the device is reverse biased, that is, when metallization M2 is positively biased with respect to metallization m1, the breakdown voltage is essentially provided by the junction between substrate 1, and on the one hand P layer 3, on the other hand isolating wall 2. The limits of the space charge area, that is, the equipotential surfaces at the low potential and at the high potential, respectively, have been designated by E2L and E2H. For a device to have a high breakdown voltage, the extreme equipotential surfaces must be as spaced apart as possible to avoid reaching the breakdown voltage in the semiconductor (on the order of 20 V/$\mu$m). Thus, one of the layers in the vicinity of the junction providing the breakdown voltage must have relatively light doping so that the space charge area can extend widely enough therein.

Independently from the need to provide a sufficient breakdown voltage of the component when high voltages are applied thereacross, leakage current problems are also posed. For various reasons, for example due to contamination of the oxides, the N substrate 1 may be strongly depleted at the surface under an upper insulator layer 7. A population inversion may even be achieved in this surface region. There then appears a channel region ensuring an electric continuity between the external periphery of P region 6 and the internal periphery of isolating wall 2. To avoid such leakage currents, it is known to use a so-called stop-channel region formed of a heavily-doped N-type (N+) region 8 at the surface of substrate 1 between the external periphery of region 6 and the internal periphery of wall 2. Although this is not shown in the cross-section view, area 8 forms a ring that extends over the entire periphery of the involved component. Given its high doping level, N+ ring 8 is not likely to be inverted and thus interrupts any inversion channel that could form at the component surface. To favor the equipotentiality of stop-channel ring 8 and avoid a localized depletion, it is conventional to coat diffused ring 8 with a metallization (not shown). To favor the spreading of the equipotential surfaces, in reverse biasing, it is also known to coat the upper surface of isolating wall 2 with a metallization 9 that partially extends towards the inside above insulator 7, thus forming a field plate.

Thus, with peripheral structures of the type of that in FIG. 1 in which the component is surrounded with an isolating wall, very good breakdown voltage properties are obtained. However, this requires very long diffusions at high temperatures, for example 300 hours at 1280° C. Further, these diffusions, once performed, occupy a non-negligible surface that may even be greater than the surface of the component that they delimit.

It has thus been attempted to form peripheral structures with no isolating wall. An example of such a structure is illustrated in FIG. 2A. On the upper surface side, substantially the same elements as in FIG. 1 are shown, except for the fact that there is no lateral P well. An N+-type region 10 is only formed at the vicinity of the periphery. Region 10 will preferably be more distant from the outer edge of P-type region 6 than was stop-channel region 8 of FIG. 1.

On the lower surface side, a structure substantially symmetrical to that of the upper surface is formed. Thus, P-type region 3 is interrupted and is surrounded with a lightly-doped P-type region 12 similar to region 6 on the upper surface side. Also, on the lower surface side, an isolating layer 13 is deposited at the component periphery and metallization M1 is in contact with the sole P+ region and extends slightly above isolating region 12. An N+-type region 14 is also formed at the component periphery.

This type of structure, in addition to the fact that it poses more delicate breakdown voltage problems than in the case of FIG. 1, poses a problem when forming the solderings. Conventionally, a vertical component is entirely soldered by its lower surface on a radiator or heat sink via a land for soldering 20 (FIG. 2B). If the heat sink extends over a surface at least equal to the lower surface of the component, soldering 20 tends to have a greater lateral extension and possibly to continue upwards along the component surface. This upward extension is designated by reference 22. This structure has a double disadvantage. On the one hand, the soldering has a field plate function and tends to have potential E2H extend to N+ region 14 and alter the breakdown voltage. On the other hand, soldering extension 22 forms a short-circuit for the component.

To avoid these problems, a heat sink such as illustrated in FIG. 2C, having an upper surface including a boss 24 of smaller surface area than the land intended to be assembled thereon, tends to be used. Thus, soldering 20, even if it exhibits a slight extension 26, will not act as a field plate tending to spread equipotential surface E2H and will not tend to create a short-circuit either. This solution provides satisfactory results but poses manufacturing problems. Indeed, the size of boss 24 is linked to the chip size. A specific heat sink must thus be provided for each chip dimension, not to mention positioning difficulties.

Another solution also provided to solve this type of problem is to dig into the component periphery and fill the hollowing with a glass. However, the presence of glass poses temperature withstand problems and makes cutting operations more delicate.

SUMMARY OF THE INVENTION

Thus, an object of the present invention is to provide a peripheral power component structure enabling obtaining of high voltages.

Another object of the present invention is to provide such a structure that raises no manufacturing difficulties.

Another object of the present invention is to provide such a structure that raises no other secondary problems such as those previously mentioned.

To achieve these and other objects, the present invention provides a power component formed in a silicon substrate of a first conductivity type, the lower and upper surfaces of which respectively include a first and a second region of the second conductivity type that do not extend to the component periphery, a high voltage being capable of existing between the first and second regions and having to be withstood by the junctions between the first and second regions and the substrate. A deep insulating region that does not join the first region is provided at the lower periphery of the component, the lower substrate surface between said deep insulating region being coated with an insulating layer, the height of the deep insulating region being greater than that of a possible soldering upward extension formed during the soldering of the lower surface on a heat sink.

According to an embodiment of the present invention, the power component further includes a wide and shallow groove before the deep insulating region.

According to an embodiment of the present invention, the deep insulating region is formed by first etching close grooves from the lower substrate surface at the periphery thereof, and by then performing a thermal oxidation, so that the ribs between the various grooves are oxidized and the grooves are filled.

The foregoing objects, features and advantages of the present invention, will be discussed in detail in the following non-limiting description of specific embodiments in connection with the accompanying drawings.

BRIEF DESCRIPTION OF THE DRAWINGS

FIGS. 1, 2A, 2B, and 2C are simplified cross-section views of a peripheral area of a high-voltage component according to prior art;

DETAILED DESCRIPTION

In the various drawings, as usual in the representation of semiconductor components, the various dimensions are not drawn to scale and have been arbitrarily drawn to facilitate the readability of the drawings and make them more intelligible. Those skilled in the art will know how to adapt the various thicknesses and doping levels according to the usual rules of semiconductor power component manufacturing.

Figure 3:
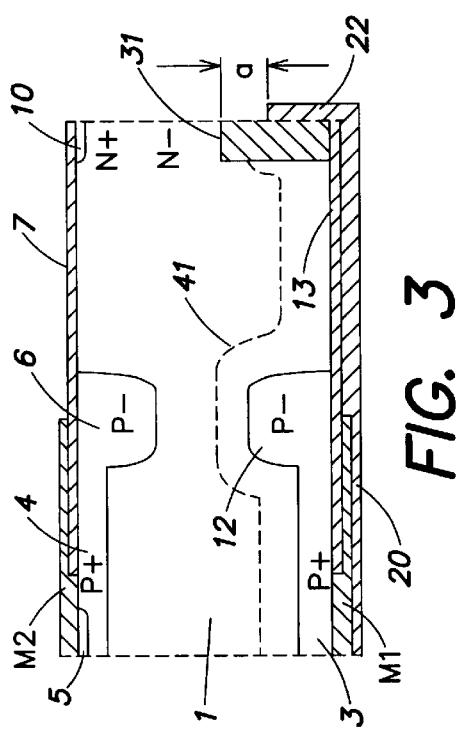
FIG. 3 is a simplified cross-section view of a peripheral area of a high-voltage component according to the present invention.

FIG. 3 shows the same peripheral region of a high-voltage component as that shown in FIGS. 1 and 2. More specifically, the structure illustrated in FIG. 3 is similar to that illustrated in FIG. 2B. It has been shown while a soldering 20 is formed on the lower surface side and exhibits an upward lateral extension 22. The structure of the present invention is similar to that of FIG. 2B, except that, at the periphery, instead of providing an N+ region, a relatively deep peripheral insulating layer 31 is provided, which is anyhow deeper by a distance a than the maximum possible distance of the soldering extension for a given assembly process. Then, region 31 no longer behaves as a short-circuit but as an insulator located under a field plate. The equipotential surfaces, one of which is designated by reference 41, thus tend to extend to reach the lateral component surface, which is a particularly favorable configuration for a high breakdown voltage.

Figure 4A:
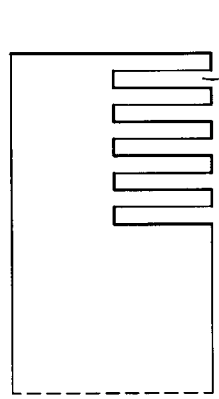
FIGS. 4A and 4B show two successive steps of the forming of an insulating area according to the present invention.
Figure 4B:
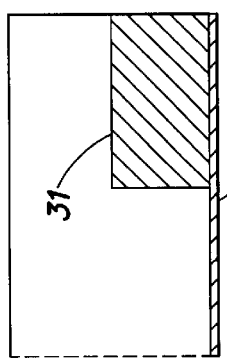

FIGS. 4A and 4B are partial views of the lower right corner of a structure, illustrating a method of forming deep insulating region 31. In a first step illustrated in FIG. 4A, deep close grooves 33 are formed by any known means in the lower right corner of the substrate, starting from the lower surface. In a second step, an oxidation is performed, to oxidize the ribs remaining between the above-mentioned grooves, fill these grooves, and oxidize the lower substrate surface.

Figure 5A:
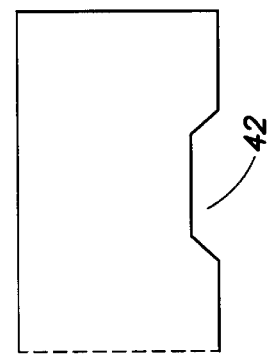
FIGS. 5A, 5B, and 5C show successive steps of the forming of an insulating area according to an alternative of the present invention.
Figure 5B:
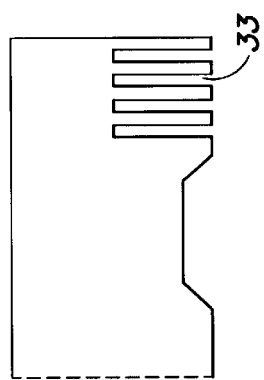
Figure 5C:
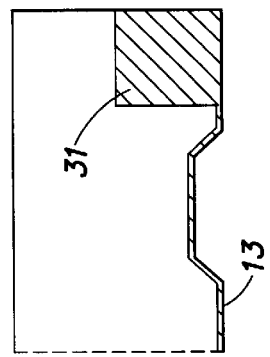

According to an alternative embodiment of the present invention illustrated in FIGS. 5A to 5C, a shallow groove 42 intended for absorbing part of a possible soldering excess may previously be formed, before forming grooves 33 and oxidations 31 and 13. This shallow groove 42 limits possible soldering extensions.

The present invention is likely to have various alterations, modifications, and improvements which will readily occur to those skilled in the art. The dimensions will be chosen to enable chosen breakdown voltage and current.

The present invention has advantages with respect to all the previously-described peripheral structures.

As compared to the peripheral isolating wall structure illustrated in FIG. 1, the present invention has the advantage of a greater manufacturing simplicity by avoiding formation of the isolating walls.

As compared to the structure in FIG. 2, the present invention has the advantage of a better breakdown voltage while enabling use of chip supports with no boss or shouldering.

As compared to a structure with a dug and glassivated periphery, the present invention has the advantage of a greater simplicity of implementation and of a greater ease of cutting between two adjacent chips. Although a single chip has been described in the foregoing description, said chip will be made from a silicon wafer with a large surface area. Lateral insulating regions 31 will in fact correspond to the separation between two neighboring chips and the cutting will be easy to perform from a silicon oxide region.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A power component formed in a silicon substrate of a first conductivity type, lower and upper surfaces of which respectively include a first and a second region of the second conductivity type that do not extend up to a periphery of the component, a high voltage being capable of existing between the first and second regions and having to be withstood by junctions between the first and second regions and the substrate, including an insulating region, formed in the lower surface of the substrate at the periphery of the component without joining the first region, the lower surface of the substrate between said insulating region and the first region being coated with an insulating layer, a height of the insulating region being greater than that of a soldering upward extension formed during the soldering of the lower surface on a heat distributor.

2. The power component of claim 1, further including a wide and shallow groove formed in the lower surface of the substrate between the insulating region and the first region.

3. A method for manufacturing the power component of claim 1, wherein the deep insulating region is formed by first etching close grooves from the lower substrate surface at the periphery thereof, and by then performing a thermal oxidation, so that the ribs between the various grooves are oxidized and the grooves are filled.

4. The power component of claim 1, further comprising a first metal contact coupled to the first region of second conductivity type and a second metal contact coupled to the second region of second conductivity type.

5. A power component comprising:
a silicon substrate of a first conductivity type;
a first region of a second conductivity type disposed in the silicon substrate at a first surface of the silicon substrate;
a second region of the second conductivity type disposed in the silicon substrate at a second surface of the silicon substrate; and
an insulating region disposed in the silicon substrate at a periphery of the silicon substrate such that a portion of the silicon substrate separates the insulating region from the first region and the second region, the insulating region being arranged to provide isolation between the first and second regions and a solder extension disposed at the periphery of the silicon substrate.

6. The power component according to claim 5, further comprising:
a third region of the second conductivity type, disposed in the silicon substrate at the first surface of the silicon substrate, the third region being connected to the first region.

7. The power component according to claim 6, wherein the third region has a concentration of dopant lower than a concentration of dopant in the first region.

8. The power component according to claim 6, wherein the third region extends further into the silicon substrate than the first region extends into the silicon substrate.

9. The power component according to claim 5, further comprising:
a fourth region of the second conductivity type, disposed in the silicon substrate at the second surface of the silicon substrate, the fourth region being connected to the second region.

10. The power component according to claim 9, wherein the fourth region has a concentration of dopant lower than a concentration of dopant in the second region.

11. The power component according to claim 9, wherein the fourth region extends further into the silicon substrate than the second region extends into the silicon substrate.

12. The power component according to claim 9, wherein a region formed by the combination of the second region an the fourth region is disposed in the silicon substrate such that it does not contact the periphery of the silicon substrate.

13. The power component according to claim 5, wherein the first region is disposed in the silicon substrate such that it does not contact the periphery of the silicon substrate.

14. The power component according to claim 5, wherein the second region is disposed in the silicon substrate such that it does not contact the periphery of the silicon substrate.

15. The power component according to claim 6, wherein a region formed by the combination of the first region and the third region is disposed in the silicon substrate such that it does not contact the periphery of the silicon substrate.

16. The power component according to claim 5, further comprising an insulating layer on the second surface of the silicon substrate.

17. The power component according to claim 5, wherein the insulating region is disposed at a corner of the silicon substrate formed by the first surface of the silicon substrate and a side of the silicon substrate.

18. The power component according to claim 17, wherein the insulating region has a height greater than a height of an upward extension formed by a soldering of the second surface to a heat distributor.

19. The power component according to claim 17, wherein the insulating region comprises an oxidized portion of the substrate.

20. The power component according to claim 5, further comprising;
a first metal contact connected to the first region of the second conductivity type; and
a second metal contact connected to the second region of the second conductivity type.

21. The power component of claim 5, wherein the silicon substrate further comprises a shallow groove in the second surface of the silicon substrate.

22. The power component of claim 5, further comprising a heavily doped third region of the first conductivity type formed in the second region at the first surface.

23. The power component of claim 22, further comprising a heavily doped fourth region of the first conductivity type formed in the substrate at the first surface.

24. A power component comprising:
a silicon substrate of a first conductivity type;
a first region of a second conductivity type disposed in the silicon substrate at a first surface of the silicon substrate;

a second region of the second conductivity type disposed in the silicon substrate at a second surface of the silicon substrate;

a means for creating a space charge area adjacent to the first region and delimited by a first equipotential surface and second equipotential surface, the second equipotential surface being of higher potential that the first equipotential surface; and an insulating region disposed at the second surface of the silicon substrate that prevents leakage currents and short circuiting between first and second equipotential surfaces.

25. The power component according to claim 24, wherein the means for creating a space charge area comprises a voltage placed across the first region of a second conductivity type and the second region of a second conductivity type.

26. A power component comprising:

a silicon substrate of a first conductivity type;

a first region of a second conductivity type disposed in the silicon substrate at a first surface of the silicon substrate;

a second region of the second conductivity type disposed in the silicon substrate at a second surface of the silicon substrate; and an insulating region dispose in the silicon substrate such that a portion of the silicon substrate separates the insulating region from the first region, the insulating region being arranged to protect against an alteration of a breakdown voltage of the power component and against a short-circuiting of the power component caused between either of the first and second regions and a soldering extension.

* * * * *

UNITED STATES PATENT AND TRADEMARK OFFICE
CERTIFICATE OF CORRECTION

PATENT NO. : 6,611,006 B2   Page 1 of 1
DATED : August 26, 2003
INVENTOR(S) : Mathieu Roy It is certified that error appears in the above-identified patent and that said Letters Patent is hereby corrected as shown below:

Column 8,
Line 9, should read:
-- an insulating region disposed in the silicon substrate such --

Signed and Sealed this

Ninth Day of December, 2003

JAMES E. ROGAN
*Director of the United States Patent and Trademark Office*